United States Patent
Bedwell et al.

(10) Patent No.: US 6,962,727 B2
(45) Date of Patent: *Nov. 8, 2005

(54) ORGANOSILOXANES

(75) Inventors: William B. Bedwell, San Jose, CA (US); Nigel P. Hacker, Palo Alto, CA (US); Roger Y. Leung, San Jose, CA (US); Nancy Iwamoto, Ramona, CA (US); Jan Nedbal, San Jose, CA (US); Songyuan Xie, Newark, CA (US); Lorenza Moro, Palo Alto, CA (US); Shyama P. Mukherjee, Morgan Hill, CA (US)

(73) Assignee: Honeywell International Inc., Morristown, NJ (US)

(*) Notice: Subject to any disclaimer, the term of this patent is extended or adjusted under 35 U.S.C. 154(b) by 0 days.

This patent is subject to a terminal disclaimer.

(21) Appl. No.: 10/161,561

(22) Filed: Jun. 3, 2002

(65) Prior Publication Data

US 2003/0031789 A1 Feb. 13, 2003

Related U.S. Application Data

(60) Continuation-in-part of application No. 10/078,919, filed on Feb. 19, 2002, and a continuation-in-part of application No. 09/610,567, filed on Jul. 3, 2000, now Pat. No. 6,359,099, which is a division of application No. 09/044,831, filed on Mar. 20, 1998, now Pat. No. 6,218,497, application No. 10/161,561, which is a continuation-in-part of application No. 09/611,528, filed on Jun. 3, 2000, now Pat. No. 6,512,071, which is a division of application No. 09/044,798, filed on Mar. 20, 1998, now Pat. No. 6,143,855, application No. 10/161,561, which is a continuation-in-part of application No. 09/609,499, filed on Jun. 30, 2000, now Pat. No. 6,361,820, which is a division of application No. 09/227,498, filed on Jan. 7, 1999, now Pat. No. 6,218,020, application No. 10/161,561, which is a continuation-in-part of application No. 09/609,437, filed on Jun. 30, 2000, now Pat. No. 6,358,559, which is a division of application No. 09/227,035, filed on Jan. 7, 1999, now Pat. No. 6,177,199.

(60) Provisional application No. 60/336,662, filed on Dec. 3, 2001, provisional application No. 60/334,172, filed on Nov. 29, 2001, and provisional application No. 60/334,169, filed on Nov. 20, 2001.

(51) Int. Cl.$^7$ ............................................. C23C 16/56
(52) U.S. Cl. .................. 427/255.18; 427/489; 427/503; 528/31; 528/32; 528/43
(58) Field of Search ............................ 528/31, 32, 43; 427/255.18, 489, 503; 524/356, 361; 428/447; 438/700, 781, 782

(56) References Cited

U.S. PATENT DOCUMENTS

| | | | | | |
|---|---|---|---|---|---|
| 4,808,687 | A | * | 2/1989 | Burns | 528/30 |
| 5,179,185 | A | * | 1/1993 | Yamamoto et al. | 528/32 |
| 5,494,750 | A | * | 2/1996 | Fujioka et al. | 428/402.21 |
| 5,589,162 | A | * | 12/1996 | Muraoka | 424/70.12 |
| 6,143,855 | A | * | 11/2000 | Hacker et al. | 528/31 |

* cited by examiner

Primary Examiner—Margaret G. Moore
Assistant Examiner—Marc Zimmer
(74) Attorney, Agent, or Firm—Sandra P. Thompson; Buchatter, Nemer et al.

(57) ABSTRACT

The present invention provides an organosiloxane comprising at least 80 weight percent of Formula 1: $[Y_{0.01-1.0}SiO_{1.5-2}]_a\{Z_{0.01-1.0}SiO_{1.5-2}\}_b[H_{0.01-1.0}SiO_{1.5-2}]_c$ (where Y is aryl; Z is alkenyl; a is from 15 percent to 70 percent of Formula 1; b is from 2 percent to 50 percent of Formula 1; and c is from 20 percent to 80 percent of Formula 1. The present organosiloxane may be used as ceramic binder, high temperature encapsulant, and fiber matrix binder. The present composition is also useful as an adhesion promoter in that it exhibits good adhesive properties when coupled with other materials in non-microelectronic or microelectronic applications. Preferably, the present compositions are used in microelectronic applications as etch stops, hardmasks, and dielectrics.

19 Claims, 5 Drawing Sheets

ORGANOSILOXANES

CROSS REFERENCE TO RELATED APPLICATIONS

This application is a continuation-in-part of the following applications: a) U.S. application Ser. No. 09/609,437 filed on Jun. 30, 2000 now U.S. Pat. No. 6,358,559, which is a divisional of Ser. No. 09/227,035 filed Jan. 7, 1999, now U.S. Pat. No. 6,177,199 issued on Jan. 23, 2001; b) U.S. application Ser. No. 09/609,499 filed on Jun. 30, 2000, now U.S. Pat. No. 6,361,820 which is a divisional of Ser. No. 09/227,498, filed Jan. 7, 1999, now U.S. Pat. No. 6,218,020 issued on Apr. 17, 2001; c) U.S. application Ser. No. 09/610,567 filed on Jul. 3, 2000, now U.S. Pat. No. 6,359,099, which is a divisional of Ser. No. 09/044,831, filed Mar. 20, 1998, now U.S. Pat. No. 6,218,497 issued on Apr. 17, 2001; d) U.S. application Ser. No. 09/611,528 filed on Jun. 30, 2000, now U.S. Pat. No. 4,512,070, which is a divisional of Ser. No. 09/044,798, filed Mar. 20, 1998, now U.S. Pat. No. 6,143,855 issued on Nov. 7, 2000; and e) U.S. application Ser. No. 10/078,919 filed on Feb. 19, 2002 (claiming the benefit of pending provisional patent applications U.S. Ser. No. 60/334,169 filed Nov. 20, 2001; U.S. Ser. No. 60/334,172 filed Nov. 29, 2001; and U.S. Ser. No. 60/336,662 filed Dec. 3, 2001, all of which are incorporated herein by reference in their entireties.

FIELD OF THE INVENTION

The present invention relates to semiconductor devices, and in particular, to semiconductor devices having low dielectric constant materials therein.

BACKGROUND OF THE INVENTION

In an effort to increase the performance and speed of semiconductor devices, semiconductor device manufacturers have sought to reduce the linewidth and spacing of interconnects while minimizing the transmission losses and reducing the capacitative coupling of the interconnects. One way to diminish power consumption and reduce capacitance is to decrease the dielectric constant (also referred to as "k") of the insulating material, or dielectric, that separates the interconnects. Insulator materials having low dielectric constants are especially desirable, because they typically allow faster signal propagation, reduce capacitance and cross talk between conductor lines, and lower voltages required for driving integrated circuits. Therefore, as interconnect linewidths decrease, concomitant decreases in the dielectric constant of the insulating material are required to achieve the improved performance and speed desired of future semiconductor devices. For example, devices having interconnect linewidths of 0.13 or 0.10 micron and below seek an insulating material having a dielectric constant (k)<3. Semiconductor device manufacturers also seek materials that in addition to having a low dielectric constant, have the mechanical and thermal stability needed to withstand the thermal cycling and processing steps of semiconductor device manufacturing.

In a typical damascene process, a line pattern is etched in the surface of a insulating material, and the trenches formed in this manner, i.e., the horizontal structure created to house the horizontal electrical connections within a particular level or layer in a semiconductor device, is filled with copper by electroplating, electroless plating, or sputtering. After the copper is deposited onto the entire surface, a chemical-mechanical planarization (CMP) step is employed to remove excess copper, and to planarize the wafer for subsequent processing steps. This process is typically repeated several times to form vias, i.e., the vertical structures created to contain the vertical electrical connections that connect the trenches between at least two metal levels or layers of metal in a semiconductor device.

To further improve the damascene process, via and line formation can be integrated into a single process, which is then called dual damascene process. In the dual damascene process, a via dielectric layer is laid down onto a substrate, and the via dielectric layer is subsequently coated with a patterned etch stop layer, i.e., a layer that controls the etching or removal of the dielectric, whereby voids in the etch stop layer correspond to positions of vias that will be etched into the via dielectric. In a next step, a line dielectric is deposited onto the etch stop layer, which in turn is coated with a patterned hardmask layer that defines the traces of the lines. Current hardmask layers are made of silicon nitride, silicon oxynitride, silicon oxide, or silicon carbide. In a following step via and line traces are formed, whereby the line trenches are etched into the line dielectric until the etchant reaches the etch stop layer. In positions where there is no etch stop layer, the etching process continues through the via dielectric to form a via. As in the damascene process, etched via and line traces are filled with copper (after applying a Ta(N) barrier layer and a Cu-seed layer) and a CMP step finishes the dual damascene process.

Dielectric etching is difficult to control with today's required trench width of 0.13 micron. Thus, the etch stop performs a critical role in semiconductor device construction. A disadvantage of known hardmask and etch stop materials is their relatively high dielectric constant (k-value). For example, typical hardmask and etch stop materials, including SiN, SiON, $SiO_2$, and SiC, have an undesirably high dielectric constant of at least about 4.0 and are applied by chemical vapor deposition (CVD). Although J. J. Waeterloos et al., "Integration of a Low Permittivity Spin-on Embedded Hardmask for Cu/SiLK Resin Dual Damascene", Proceedings of the IEEE 2001 International Interconnect Technology Conference, pages 60–62 (Jun. 4–6, 2001) teaches that a low-k spin-on organosiloxane film may replace the preceding known etch stop materials to lower the effective k value, the article reports that the organosiloxane film has a k value of 3.2 and does not disclose any details about the organosiloxane used.

U.S. Pat. No. 4,626,556 teaches organosilsesquioxane having required alkyl and alkenyl group side chains bonded thereto and optionally aryl groups and hydrogen side chains bonded thereto as a substitute for a photoresist material. U.S. Pat. No. 4,626,556 does not teach that its organosilsesquioxane may function as an etch stop or hardmask. In Comparative A below, we made an organosilsesquioxane having the required minimum at least 50% methyl groups of U.S. Pat. No. 4,626,556 and this material did not wet known dielectric materials and thus, would not be useful as an etch stop. Although U.S. Pat. No. 4,626,556 teaches that its organosilsesquioxane films have low dielectric constants, U.S. Pat. No. 4,626,556 does not report any dielectric constant values. However, as those skilled in the art know, silanol results in an undesirable dielectric constant and U.S. Pat. No. 4,626,556's organosilsesquioxane transmission FTIR plots show that silanol (3400–3700/cm) is present. Also, U.S. Pat. No. 4,626,556 teaches in a preferred embodiment, the presence of a crosslinking agent that is light activated and as those skilled in the art know, that these materials have high dielectric constants. Also, U.S. Pat. No. 4,626,556 teaches that at least 50% of its side chains are alkyl groups since the larger the amount of the alkyl group present, the higher the heat resistance U.S. Pat. No. 4,626, 556's Examples 13 and 14 teach that its organosilsesquioxane was applied to a two inch thick silicone wafer wherein a thin film of one micron was formed; the film was then heated at 250° C. for 2 hours, at 350° C. for 1 hour, and then at 450° C. for 30 minutes, and subjected to thermogravimetric analysis, in which no weight loss was observed up to 600° C. It is not clear if the silicone wafer weight was included in the "no weight loss" reported. Today's semiconductor manufacturers require a more stringent TGA test of a film alone and not on a wafer. This current more stringent TGA test requires heating and holding at 200° C. (Weight loss represents how well the material was dried.), holding at 430° C. for 90 minutes (Weight loss represents worst case scenario for shrinkage from low temperature bake to high temperature cure.), and heating at 450° C. (Weight loss represents thermal stability.). Thus, U.S. Pat. No. 4,626, 556's organosilsesquioxane does not have the wetting characteristics, low dielectric constant, and thermal stability required by today's semiconductor manufacturers.

In 1999, AlliedSignal Inc., now Honeywell International Inc., introduced HOSP® product comprising organosiloxane having about 80% methyl groups and 20% hydrogen groups. US Patent Publication 2001/006848A1 published Jul. 5, 2001 teaches that AlliedSignal's HOSP™ product is useful as a hardmask. Unfortunately, as reported in Comparative A below, this product does not have acceptable wetting properties with organic dielectrics.

Commonly assigned U.S. Pat. Nos. 5,973,095; 6,020,410; 6,043,330; 6,177,143; and 6,287,477 teach organohydridosiloxane resins of the formula $(H_{0.4-1.0}SiO_{1.5-1.8})_n (R_{0.4-1.0}SiO_{1.5-1.8})_m$ where R is alkyl groups, aryl groups, and mixtures thereof. See also commonly assigned U.S. Pat. No. 6,015,457. Unfortunately, as reported in Comparative B below, a composition comprising 50% phenyl groups and 50% hydrogen subjected to the current stringent TGA test had a weight loss of 1.0 percent per hour.

Thus, a need still exists in the semiconductor industry to provide: a) compositions with lower dielectric constants; b) compositions with improved mechanical properties, such as thermal stability, glass transition temperature ($T_g$), and hardness; c) compositions that are capable of being solvated and spun-on to a wafer or layered material; and d) compositions that are versatile enough to function as a hardmask or an etch stop and can wet dielectric materials.

SUMMARY OF THE INVENTION

In response to this need in the art, the present invention provides an organosiloxane comprising at least 80 weight percent of Formula I: $[Y_{0.01-1.0}SiO_{1.5-2}]_a[Z_{0.01-1.0}SiO_{1.5-2}]_b [H_{0.01-1.0}SiO_{1.5-2}]_c$ where Y is aryl; Z is alkenyl; a is from 15 percent to 70 percent of Formula I; b is from 2 percent to 50 percent of Formula I; and c is from 20 percent to 80 percent of Formula I. Unlike alkyl-containing materials similar to those taught in U.S. Pat. No. 4,626,556 that do not wet known dielectric materials, the present composition wets dielectric materials as reported in our Examples below and thus, may be advantageously used as an etch stop. Contrary to U.S. Pat. No. 4,626,556's teaching that its organosilsesquioxane requires the presence of alkyl groups for heat resistance and does not require the presence of aryl groups, we have discovered that the present composition requiring the presence of aryl groups but not requiring the presence of alkyl groups has good thermal stability as evidenced by the TGA results reported below. The present composition also has a dielectric constant of preferably less than 3.2. Another benefit of the present composition is that it has a low crosslinking temperature. The present composition may contain up to 20 weight percent of other units as long as the other units do not detract from the desirable properties of the present composition.

In another embodiment, the present invention provides a spin-on etch stop comprising organosiloxane of Formula I: $[Y_{0.01-1.0}SiO_{1.5-2}]_a[Z_{0.01-1.0}SiO_{1.5-2}]_b[H_{0.01-1.0}SiO_{1.5-2}]_c$ where Y is aryl; Z is alkenyl; a is from 15 percent to 70 percent of Formula I; b is from 2 percent to 50 percent of Formula I; and c is from 20 percent to 80 percent of Formula I and having substantially no silanol and a dielectric constant of less than 3.2. This etch stop advantageously wets dielectric materials, has good adhesion to dielectric materials, has good thermal stability, and a low crosslinking temperature.

In another embodiment, the present invention provides an organosiloxane having alkenyl groups and thermal stability.

DETAILED DESCRIPTION OF THE INVENTION

Figure 1:
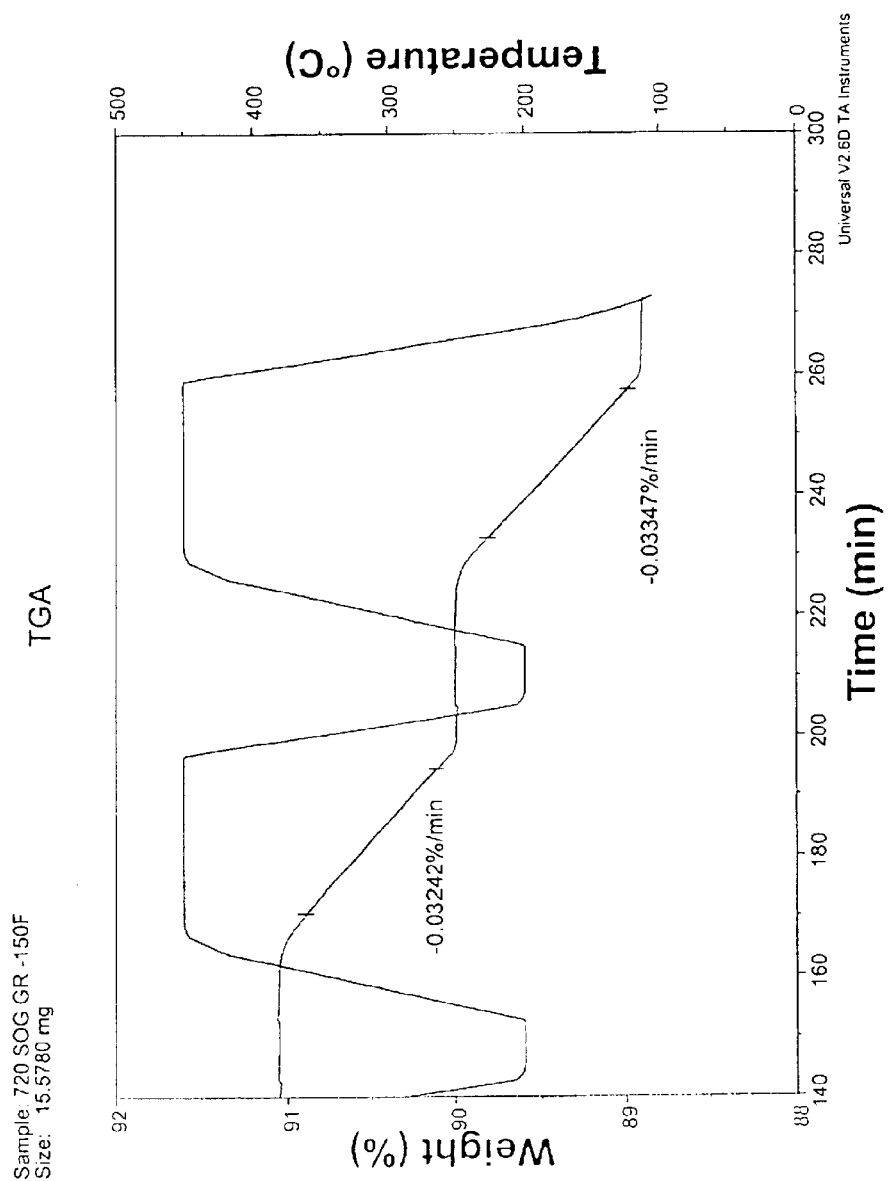
FIG. 1 shows TGA data for Honeywell Accuglass® 720 organosiloxane comprising 66% phenyl and 34% methyl.

The phrase "substantially no silanol" as used herein excludes the presence of silanol as evidenced by FTIR silanol peaks taught by U.S. Pat. No. 4,626,556.

The term "organosiloxane" as used herein means Si and carbon containing compounds, includes organosilsesquioxane, and excludes the presence of crosslinking agent activated by light as taught by U.S. Pat. No. 4,626,556.

The phrase "thermal stability" as used herein means less than 0.5 percent weight loss at 450° C.

Contemplated polymers comprise a polymer backbone encompassing alternate silicon and oxygen atoms. In Formula I above, preferably Y is phenyl, benzyl, substituted phenyl, naphthyl, anthryl, and phenanthryl. In Formula I above, preferably Z is vinyl, substituted vinyl, vinyl ether, acrylate, and methacrylate. In Formula I above, preferably a is from 30 percent to 70 percent of Formula I and b is from 10 percent to 40 percent of Formula I.

Polymers of the present invention may be produced with or without essentially no hydroxyl or alkoxy groups bonded to backbone silicon atoms. Preferably, each silicon atom, in addition to the aforementioned backbone oxygen atoms, is bonded only to hydrogen atoms and/or Y groups or Z groups as defined in Formula I. By attaching only hydrogen and/or Y and Z groups directly to backbone silicon atoms in the polymer, unwanted chain lengthening and cross-linking is avoided. And given, among other things, that unwanted chain lengthening and cross-linking is avoided in the resins of the present invention, the shelf life of these resin solutions is enhanced as compared to previously known organosiloxane resins. Furthermore, since silicon-carbon bonds are less reactive than silicon-hydrogen bonds, the shelf life of the organosiloxane resin solutions described herein is enhanced as compared to previously known hydridosiloxane resins.

Preferably, the present organosiloxane has a molecular weight from about 1,000 to about 100,000.

In a preferred embodiment, it is believed but not confirmed that the polymer backbone conformation is a cage configuration. Accordingly, there are only very low levels or reactive terminal moieties in the polymer resin given the cage conformation. A cage conformation of the polymer backbone also ensures that no unwanted chain lengthening polymerization will occur in solution, resulting in an extended shelf life. Each silicon atom of the polymer is bonded to at least three oxygen atoms. Moieties bonded to the polymer backbone include hydrogen and the organic groups described herein.

The present organosiloxane composition may be made with a dual phase solvent system using a catalyst. The starting materials encompass trichlorosilane and a combination of organotrichlorosilanes including alkenyl or aryl substituted trichlorosilane. The relative ratios of the trichlorosilane and the organotrichlorosilane determine the mole percent carbon-containing substituents in the polymer. As an example, the method is as follows. Mix a solution of hydridotrihalosilanes and organic-substituted trihalosilanes (e.g. trichlorosilane and alkenyl or aryltrichlorosilane) to provide a mixture. Combine the mixture with a dual phase solvent including a non-polar solvent, and a polar solvent to provide a dual phase reaction mixture. Add a solid phase catalyst to the silane/solvent reaction mixture. React the silanes to produce organohydridosiloxanes. Recover the organosiloxane from the organic portion of the dual phase solvent system. Additional steps may include washing the recovered organosiloxane to remove any unreacted monomer, and fractionating the organosiloxane product to thereby classify the product according to molecular weight.

A catalyst used as a phase transfer catalyst may be used such as tetrabutylammonium chloride, and benzyltrimethylammonium chloride. The phase transfer catalyst is introduced into the reaction mixture and the reaction is allowed to proceed to the desired degree of polymerization.

A dual phase solvent system including a continuous phase non-polar solvent and a polar solvent may be used. The non-polar solvent includes, but is not limited to, any suitable alkyl, alkenyl or aryl compounds or a mixture of any or all such suitable compounds, the operational definition of "suitable" in the present context includes the functional characteristics of: 1) solubilizing the monomeric silicon compounds, 2) solubilizing the resin product, 3) stability of the resin product in the solvent, and 4) insolubility of unwanted reaction products.

Contemplated solvents include any suitable pure or mixture of organic, organometallic or inorganic molecules that are volatilized at a desired temperature, such as the critical temperature. The solvent may also comprise any suitable pure or mixture of polar and non-polar compounds. In preferred embodiments, the solvent comprises water, ethanol, propanol, acetone, ethylene oxide, -benzene, toluene, ethers, cyclohexanone, butryolactone, methylethylketone, and anisole. As used herein, the term "pure" means that component that has a constant composition. For example, pure water is composed solely of $H_2O$. As used herein, the term "mixture" means that component that is not pure, including salt water. As used herein, the term "polar" means that characteristic of a molecule or compound that creates an unequal charge, partial charge or spontaneous charge distribution at one point of or along the molecule or compound. As used herein, the term "non-polar" means that characteristic of a molecule or compound that creates an equal charge, partial charge or spontaneous charge distribution at one point of or along the molecule or compound. Particularly preferred solvents include, but are not limited to, pentane, hexane, heptane, cyclohexane, benzene, toluene, xylene, halogenated solvents such as carbon tetrachloride, and mixtures thereof.

The second solvent phase is a polar phase, immiscible with the organic, non-polar solvent phase, and includes water, alcohols, and alcohol and water mixtures. It is thought that alcohol solubilizes reactive intermediates that are not yet soluble in the non-polar phase and would ordinarily be unstable in a substantially aqueous phase. The amount of alcohol present is, however, not so high as to significantly dissolve product polymers having molecular weights greater than about 400 AMUs.

Alcohols and other polar solvents suitable for use in the polar phase include, but are not limited to, water, methanol, ethanol, isopropanol, glycerol, diethyl ether, tetrahydrofuran, diglyme, and mixtures thereof. In one embodiment, the polar solvent includes a water/alcohol mixture wherein the water is present in an amount sufficient to preferentially solubilize ionic impurities not soluble in alcohol, and/or preclude solvent extraction of product compounds that might otherwise be soluble in alcohol. The polar solvent phase advantageously retains the hydrochloric acid (HCl) condensation product and any metal salt or other ionic contaminants that may be present. Since any ionic contaminants are retained in the polar solvent phase, the organosiloxane product of this invention is of high purity and contains essentially no metal contaminants.

In another embodiment of the method disclosed herein, a solid phase catalyst and/or ion exchange resin, such as the Amberjet 4200 or Amberlite I-6766 ion exchange resins (both available from Rohm and Hass Company, Philadelphia, Pa.), surface catalyzes the polymerization of the trihalosilane and organo-trihalosilane monomers into the composition of this invention. Amberjet 4200 is a basic anion exchange resin based on the chloride ion. Amberlite I-6766 is also a basic anion exchange resin. By way of explanation, and not by way of limitation, it is thought polymer chain propagation occurs on the catalyst surface by hydrolysis of the Si—Cl bond of the monomer to Si—OH, followed by condensation with another Si—OH to provide an Si—O—Si bond, thereby extending the polymer chain. In other embodiments, polymerization is catalyzed with a phase transfer catalyst such as tetrabutylammonium chloride.

The resulting siloxane/solvent solution is then filtered under ambient conditions via any of the filtration devices well known in the art. It is generally preferable to use a filtration device having a pore size less than about 1 m. A typical filtration process uses a pore size of about 0.1 m.

Utility:

The present organosiloxane may also comprise additional components such as adhesion promoters, antifoam agents, detergents, flame retardants, pigments, plasticizers, stabilizers, striation modifiers, and surfactants.

The present organosiloxane may be used as ceramic binder, high temperature encapsulant, and fiber matrix binder. The present composition is also useful as an adhesion promoter in that it exhibits good adhesive properties when coupled with other materials in non-microelectronic or microelectronic applications. In microelectronic applications, the present composition may be coupled with conventional and not-so-conventional layered materials, such as nanoporous dielectrics, cage-based dielectric materials, anti-reflective coatings, photoresist materials, conformal dielectric materials, substrates, infiltration layers, coatings, and other layering or filling materials used for producing layered stacks, electronic components, or semiconductors.

Preferably, the present compositions are used in microelectronic applications as etch stops, hardmasks, and dielectrics. Layers or films of the instant compositions may be formed by solution techniques such as spraying, rolling, dipping, spin coating, flow coating, chemical vapor deposition (CVD), or casting, with spin coating being preferred for microelectronics.

For chemical vapor deposition (CVD), the composition is placed into an CVD apparatus, vaporized, and introduced into a deposition chamber containing the substrate to be coated. Vaporization may be accomplished by heating the composition above its vaporization point, by the use of vacuum, or by a combination of the above. Generally, vaporization is accomplished at temperatures in the range of 50° C.–300° C. under atmospheric pressure or at lower temperature (near room temperature) under vacuum.

Three types of CVD processes exist: atmospheric pressure CVD (APCVD), low pressure CVD (LPCVD), and plasma enhanced CVD (PECVD). Each of these approaches had advantages and disadvantages. APCVD devices operate in a mass transport limited reaction mode at temperatures of approximately 400° C. In mass-transport limited deposition, temperature control of the deposition chamber is less critical than in other methods because mass transport processes are only weakly dependent on temperature. As the arrival rate of the reactants is directly proportional to their concentration in the bulk gas, maintaining a homogeneous concentration of reactants in the bulk gas adjacent to the wafers is critical. Thus, to insure films of uniform thickness across a wafer, reactors that are operated in the mass transport limited regime must be designed so that all wafer surfaces are supplied with an equal flux of reactant. The most widely used APCVD reactor designs provide a uniform supply of reactants by horizontally positioning the wafers and moving them under a gas stream.

In contrast to APCVD reactors, LPCVD reactors operate in a reaction rate-limited mode. In processes that are run under reaction rate-limited conditions, the temperature of the process is an important parameter. To maintain a uniform deposition rate throughout a reactor, the reactor temperature must be homogeneous throughout the reactor and at all wafer surfaces. Under reaction rate-limited conditions, the rate at which the deposited species arrive at the surface is not as critical as constant temperature. Thus, LPCVD reactors do not have to be designed to supply an invariant flux of reactants to all locations of a wafer surface.

Under the low pressure of an LPCVD reactor, for example, operating at medium vacuum (30–250 Pa or 0.25–2.0 torr) and higher temperature (550–600° C.), the diffusivity of the deposited species is increased by a factor of approximately 1000 over the diffusivity at atmospheric pressure. The increased diffusivity is partially offset by the fact that the distance across which the reactants must diffusive increases by less than the square root of the pressure. The net effect is that there is more than an order of magnitude increase in the transport of reactants to the substrate surface and by-products away from the substrate surface.

LPCVD reactors are designed in two primary configurations: (a) horizontal tube reactors; and (b) vertical flow isothermal reactors. Horizontal tube, hot wall reactors are the most widely used LPCVD reactors in VLSI processing. They are employed for depositing poly-Si, silicon nitride, and undoped and doped $SiO_2$ films. They find such broad applicability primarily because of their superior economy, throughput, uniformity, and ability to accommodate large diameter, e.g., 150 mm, wafers.

The vertical flow isothermal LPCVD reactor further extends the distributed gas feed technique so that each wafer receives an identical supply of fresh reactants. Wafers are again stacked side by side, but are placed in perforated-quartz cages. The cages are positioned beneath long, perforated, quartz reaction-gas injector tubes, one tube for each reactant gas. Gas flows vertically from the injector tubes, through the cage perforations, past the wafers, parallel to the wafer surface and into exhaust slots below the cage. The size, number, and location of cage perforations are used to control the flow of reactant gases to the wafer surfaces. By properly optimizing cage perforation design, each wafer may be supplied with identical quantities of fresh reactants from the vertically adjacent injector tubes. Thus, this design may avoid the wafer-to-wafer reactant depletion effects of the end-feed tube reactors, requires no temperature ramping, produces highly uniform depositions, and reportedly achieves low particulate contamination.

The third major CVD deposition method is PECVD. This method is categorized not only by pressure regime, but also by its method of energy input. Rather than relying solely on thermal energy to initiate and sustain chemical reactions, PECVD uses an rf-induced glow discharge to transfer energy into the reactant gases, allowing the substrate to remain at a lower temperature than in APCVD or LPCVD processes. Lower substrate temperature is the major advantages of PECVD, providing film deposition on substrates not having sufficient thermal stability to accept coating by other methods. PECVD may also enhance deposition rates over those achieved using thermal reactions. Moreover, PECVD may produce films having unique compositions and properties. Desirable properties such as good adhesion, low pinpole density, good step coverage, adequate electrical properties, and compatibility with fine-line pattern transfer processes, have led to application of these films in VLSI.

PECVD requires control and optimization of several deposition parameters, including rf power density, frequency, and duty cycle. The deposition process is dependent in a complex and interdependent way on these parameters, as well as on the usual parameters of gas composition, flow rates, temperature, and pressure. Furthermore, as with LPCVD, the PECVD method is surface reaction limited, and adequate substrate temperature control is thus necessary to ensure uniform film thickness.

CVD systems usually contain the following components: gas sources, gas feed lines, mass-flow controllers for metering the gases into the system, a reaction chamber or reactor, a method for heating the wafers onto which the film is to be deposited, and in some types of systems, for adding additional energy by other means, and temperature sensors. LPCVD and PECVD systems also contain pumps for establishing the reduced pressure and exhausting the gases from the chamber.

Suitable solvents for use in such solutions of the present compositions of the present invention include any suitable pure or mixture of organic, organometallic, or inorganic molecules that are volatized at a desired temperature. Suitable solvents include aprotic solvents, for example, cyclic ketones such as cyclopentanone, cyclohexanone, cycloheptanone, and cyclooctanone; cyclic amides such as N-alkylpyrrolidinone wherein the alkyl has from about 1 to 4 carbon atoms; and N-cyclohexylpyrrolidinone and mixtures thereof. A wide variety of other organic solvents may be used herein insofar as they effectively control the viscosity of the resulting solution as a coating solution. Various facilitating measures such as stirring and/or heating may be used to aid in the dissolution. Other suitable solvents include methyethylketone, methylisobutylketone, dibutyl ether, cyclic dimethylpolysiloxanes, butyrolactone, γ-butyrolactone, 2-heptanone, ethyl 3-ethoxypropionate, polyethylene glycol [di]methyl ether, propylene glycol methyl ether acetate (PGMEA), anisole, and hydrocarbon solvents such as mesitylene, xylenes, benzene, and toluene. A preferred solvent is cyclohexanone.

Typically, layer thicknesses are between 0.001 to about 15 microns. In microelectronics, the layer thickness is generally less than 2 microns. The amount of solvent added to the composition is at least about 70 weight percent.

The present composition may be used as an interlayer dielectric in an interconnect associated with a single integrated circuit ("IC") chip. An integrated circuit chip would typically have on its surface a plurality of layers of the instant composition and multiple layers of metal conductors. It may also include regions of the present composition between discrete metal conductors or regions of conductor in the same layer or level of an integrated circuit.

In application of the instant polymers to ICs, a solution of the present composition is applied to a semiconductor wafer using conventional wet coating processes as, for example, spin coating; other well known coating techniques such as spray coating, flow coating, or dip coating may be employed in specific cases. In the spin coating process, the organosiloxane resin solution prepared in the manner described above is dispensed onto a wafer at or near its center. In some embodiments, the wafer will remain stationary during the dispense cycle, while in some embodiments, the wafer will turn or spin at a relatively low speed, typically at least about 200 revolutions per minute (rpm). Optionally, the dispense cycle may be followed by a short rest period and then additional spins, hereinafter referred to as thickness spins, generally between approximately 500 and 3000 rpm, although other spin speeds may be used, as appropriate. As an illustration, a cyclohexanone solution of the present composition is spin-coated onto a substrate having electrically conductive components fabricated therein and the coated substrate is then subjected to thermal processing. The present composition may be used in substractive metal (such as aluminum and aluminum/tungsten) processing and dual damascene (such as copper) processing. An exemplary formulation of the instant composition is prepared by dissolving the present composition in cyclohexanone solvent under ambient conditions with strict adherence to a clean-handling protocol to prevent trace metal contamination in any conventional apparatus having a non-metallic lining. The resulting solution comprises based on the total solution weight, from preferably about 0.02 to about 50 weight percent of the present composition and about 50 to about 99.98 weight percent solvent and more preferably from about 0.10 to about 30 weight percent of the present composition and about 70 to about 99.9 weight percent solvent.

An illustration of the use of the present invention follows. A solvent solution of the present composition is provided in an amount of from about 0.05 to about 30 weight percent (%) based on the composition. Application of the instant compositions onto planar or topographical surfaces or substrates may be carried out by using any conventional apparatus, preferably a spin coater, because the compositions used herein have a controlled viscosity suitable for such a coater. Complete evaporation of the solvent by any suitable means, such as simple air drying during spin coating, by exposure to an ambient environment, or by heating on a hot plate or a plurality of hot plates up to 350° C., may be employed. The substrate may have on it at least one layer of the present composition. Further curing may be achieved by a hot temperature, i.e, greater than 300° C., hot plate or furnace. In addition to furnace or hot plate curing, the present compositions may also be cured by exposure to ultraviolet radiation, microwave radiation, or electron beam radiation as taught by commonly assigned patent publication PCT/US96/08678; PCT/US00/28689 (WO 01/29052); and PCT/US00/28738 (WO 01/29141); and U.S. Pat. Nos. 6,042,994; 6,080,526; 6,177,143; and 6,235,353, which are incorporated herein by reference in their entireties. The present compositions may also be subjected to ultraviolet radiation, microwave radiation, or electron beam radiation to achieve certain desirable film properties.

After application of the present composition to an electronic topographical substrate, the coated structure is subjected to a bake and cure thermal process at increasing temperatures ranging from about 50° C. up to about 450° C. to polymerize the coating. The preferred curing temperature is at least about 150° C. Generally, it is preferred that curing is carried out at temperatures of from about 350° C. to about 425° C. Curing may be carried out in a conventional curing chamber such as an electric furnace, hot plate, and the like and is generally performed in an inert (non-oxidizing) atmosphere (nitrogen) in the curing chamber. Any non-oxidizing or reducing atmospheres (eg. argon, helium, hydrogen, and nitrogen processing gases) may be used in the practice of the present invention. One advantage of the present composition is that it has minimal weight loss during curing as indicated in the Examples below.

As indicated earlier, the present coating may act as an interlayer and be on top of or covered by other organic or inorganic coatings, such as other dielectric ($SiO_2$) coatings, $SiO_2$ modified ceramic oxide layers, silicon containing coatings, silicon carbon containing coatings, silicon nitrogen containing coatings, silicon-nitrogen-carbon containing coatings, diamond like carbon coatings, titanium nitride coatings, tantalum nitride coatings, tungsten nitride coatings, aluminum coatings, copper coatings, tantalum coatings, organosiloxanes coatings, organo silicon glass coatings, and fluorinated silicon glass coatings. Such multilayer coatings are taught in U.S. Pat. No. 4,973,526, which is incorporated herein by reference. And, as amply demonstrated, the present compositions prepared in the instant process may be readily formed as interlined dielectric layers between adjacent conductor paths on fabricated electronic or semiconductor substrates.

A semiconductor device comprising a film of the present composition typically has a second film adjacent to the first film. This second film may be an inorganic or organic material. A preferred organic material is an aromatic or aliphatic hydrocarbon and more preferably, an adamantane or diamantane based material is used. Examples of useful materials for the second film include but are not limited to those disclosed in International Publication WO00/31183 published Jun. 2, 2000 and our pending patent applications Serial PCT/US01/22204 filed Oct. 17, 2001; PCT/US01/50182 filed Dec. 31, 2001; Ser. No. 60/345,374 filed Dec. 31, 2001; Ser. No. 60/347,195 filed Jan. 8, 2002; Ser. No. 60/384,303 filed May 30, 2002; Ser. No. 60/350,187 filed Jan. 15, 2002 converted 10/158,513 filed May 30, 2002; Ser. No. 10/158,548 filed May 30, 2002; and Ser. No. 10/160,773 filed May 30, 2002; commonly assigned U.S. Pat. Nos. 6,126,733; 5,115,082; 5,986,045; and 6,143,855; and commonly assigned International Patent Publications WO02/29052 published Apr. 26, 2001; and WO01/29141 published Apr. 26, 2001.

The present composition has a dielectric constant of preferably less than 3.2 and more preferably from about 2.5 to less than 3.2.

The present composition may be used in a desirable all spin-on stacked film as taught by Michael E. Thomas, "Spin-On Stacked Films for Low $k_{eff}$ Dielectrics", *Solid State Technology* (July 2001), incorporated herein in its entirety by reference.

Analytical Test Methods:

Dielectric Constant: The dielectric constant was determined by coating a thin film of aluminum on the cured layer and then doing a capacitance-voltage measurement at 1 MHz and calculating the k value based on the layer thickness.

Shrinkage/Expansion: Film shrinkage or expansion was measured by determining the film thickness before and after the process. Shrinkage was expressed in percent of the original film thickness. Shrinkage was positive if the film thickness decreased. The actual thickness measurements were performed optically using a J. A. Woollam M-88 spectroscopic ellipsometer. A Cauchy model was used to calculate the best fit for Psi and Delta (details on Ellipsometry can be found in e.g. "Spectroscopic Ellipsometry and Reflectometry" by H. G. Thompkins and William A. McGahan, John Wiley and Sons, Inc., 1999).

Refractive Index: The refractive index measurements were performed together with the thickness measurements using a J. A. Woollam M-88 spectroscopic ellipsometer. A Cauchy model was used to calculate the best fit for Psi and Delta. Unless noted otherwise, the refractive index was reported at a wavelenth of 633 nm (details on Ellipsometry can be found in e.g. "Spectroscopic Ellipsometry and Reflectometry" by H. G. Thompkins and William A. McGahan, John Wiley and Sons, Inc., 1999).

FTIR analysis: FTIR spectra were taken using a Nicolet Magna 550 FTIR spectrometer in transmission mode. Substrate background spectra were taken on uncoated substrates. Film spectra were taken using the substrate as background. Film spectra were then analyzed for change in peak location and intensity. The results are reported in an absorbance mode.

Isothermal Gravimetric Analysis (ITGA) Weight Loss: Total weight loss was determined on the TA Instruments 2950 Thermogravimetric Analyzer (TGA) used in conjunction with a TA Instruments thermal analysis controller and associated software. A Platinel II Thermocouple and a Standard Furnace with a temperature range of 25° C. to 1000° C. and heating rate of 0.1° C. to 100° C./min were used. A small amount of sample (7 to 12 mg) was weighed on the TGA's balance (resolution: 0.1 $\mu$g; accuracy: to ±0.1%) and heated on a platinum pan. Samples were heated under nitrogen with a purge rate of 100 ml/min (60 ml/min going to the furnace and 40 ml/min to the balance).

Tape Test: The tape test was performed following the guidelines given in ASTM D3359-95. A grid was scribed into the dielectric layer according to the following. A tape test was performed across the grid marking in the following manner: (1) a piece of adhesive tape, preferably Scotch brand #3 m600-1/2X1296, was placed on the present layer, and pressed down firmly to make good contact; and (2) the tape was then pulled off rapidly and evenly at an angle of 180° to the layer surface. The sample was considered to pass if the layer remained intact on the wafer, or to have failed if part or all of the film pulled up with the tape.

Particle Count: Film particles counts were measured on a KLA 6420 Surfscan. An oxide recipe with a film thickness matching the product film thickness was used. The recipe was set up with the lowest size threshold to be 0.2 microns. The particle number reported is the total number of particles detected above the size threshold.

Candela Film: Wafers were analyzed with a Candela OSA and spun at 5000 rpm for the measurements. The data was acquired using S-specular acquisition mode with 50 microns track spacing and 16K data points per track. The resulting images were inspected visually for defects. No quantitative analysis was performed.

Contact Angle: The contact angle measurement was performed to determine the contact angle of the dielectric solution on the inventive product in order to create a Si-wafer/dielectric/inventive product/dielectric stack. A VCA2500 Video Contact Angle System from ASC Products was used to perform the measurements. In preparation for the measurement, the wafer was coated with the first dielectric layer and then the inventive product layer. For the measurement, a droplet of the dielectric solution which was to be deposited as the top layer was brought in contact with the inventive product surface. The droplet volume was set to 0.8 microliter. The video image was captured for the next 3.5 seconds beginning with time when the droplet was formed on the surface. The contact angle was then measured on the captured video image using the contact angle measurement software. The average of five measurements is reported.

EXAMPLES

Comparative A:

Organosilsesquioxanes having 60–80% alkyl groups having 4 carbons or less and 20–40% hydrogen dewetted or had poor wetting with the organic dielectric of commonly assigned pending patent application U.S. Serial No. 60/350,187 filed Jan. 15, 2002. Such organosiloxanes had the required minimum of at least 50% methyl groups taught by U.S. Pat. No. 4,626,556; the contact angle with the aforementioned organic dielectric ranged from 15–39°. Such organosiloxanes also included Honeywell HOSP® product comprising about 80% methyl groups and 20% hydrogen groups; the contact angle of HOSP® product with the aforementioned organic dielectric was 35°.

Comparative B:

FIG. 1 shows the TGA results for Honeywell Accuglass® 720 product comprising organosiloxane with 66% phenyl and 34% methyl. The program was: (a) ramp to 200° C. and hold for 15 minutes at 200° C., (b) then ramp to 430° C. and hold for 90 minutes at 430° C., and (c) two cycles ramping from 200° C. to 450° C. with a hold at 450° C. for 30 minutes. Based on the TGA, the weight loss was 1.9 percent per hour.

Figure 2:
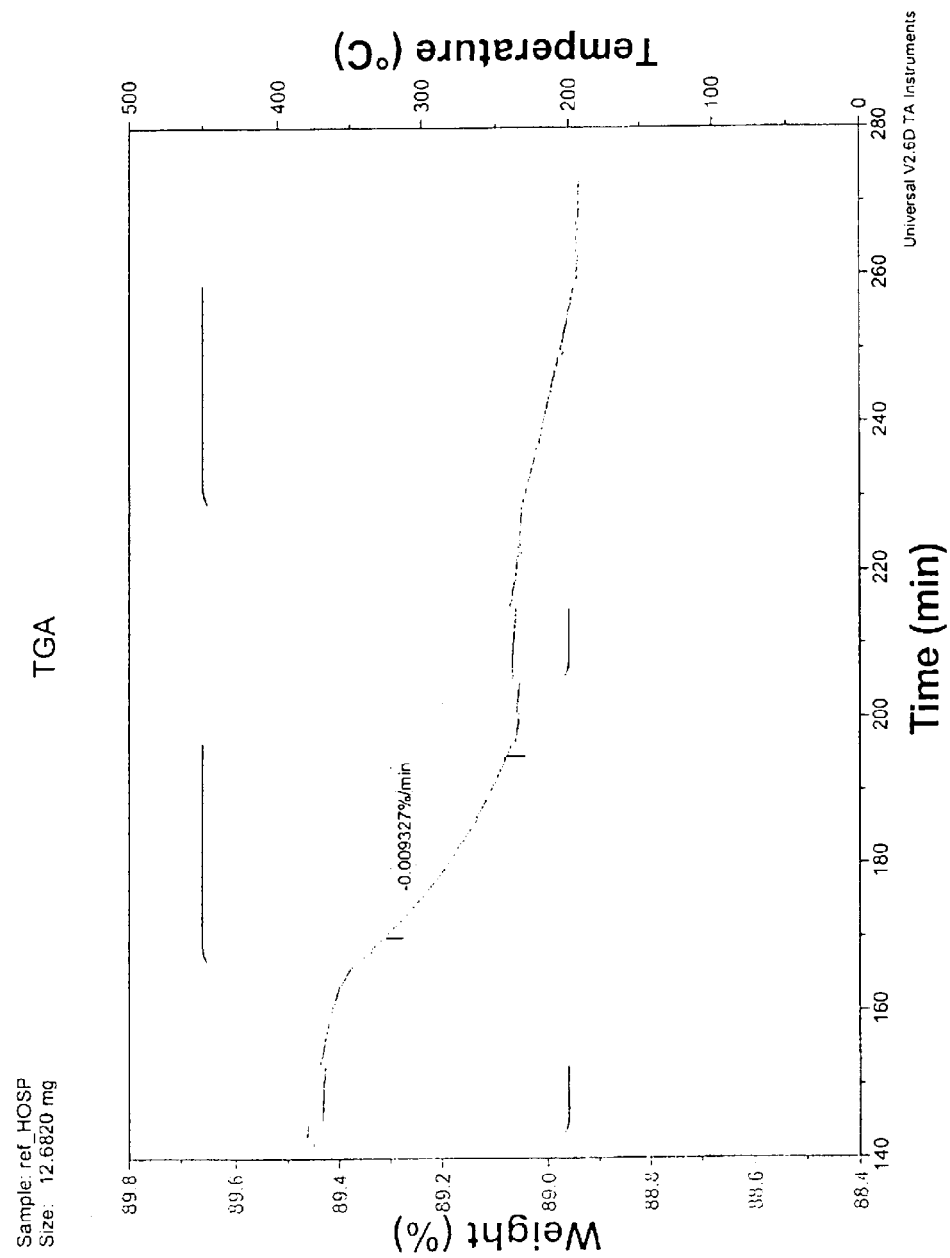
FIG. 2 shows TGA data for Honeywell HOSP® organosiloxane having 80% methyl groups and 20% hydrogen.

AlliedSignal Inc.'s HOSP™ Product Bulletins (dated November 1998 and February 1999) teach that HOSP™ polymer is thermally stable to 550° C. and Honeywell's "Integration of HOSP® in Cu-Damascene Interconnect", IITC 2000 teaches that HOSP® polymer has TDMS stability to >450° C. However, when we subjected HOSP® polymer comprising organosiloxane having 80% methyl groups and 20% hydrogen to the current more stringent TGA test, the weight loss was 0.56 percent per hour as shown in FIG. 2.

Figure 3:
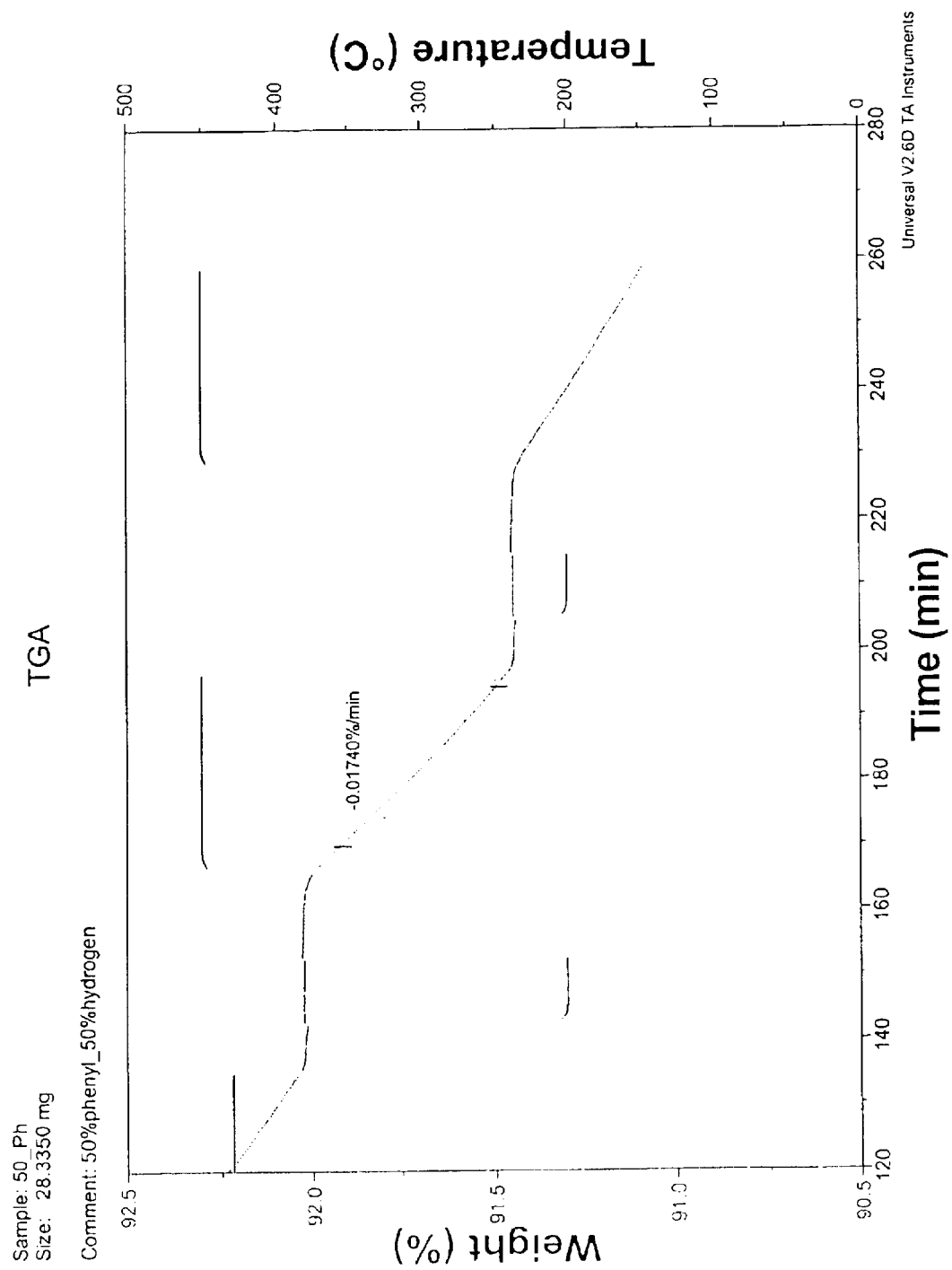
FIG. 3 shows TGA data for organosiloxane having 50% phenyl groups and 50% hydrogen.

We also made an organosiloxane comprising 50% phenyl groups and 50% hydrogen as covered by commonly assigned U.S. Pat. Nos. 5,973,095; 6,020,410; 6,043,330; 6,177,143; and 6,287,477. FIG. 3 shows the TGA results for this product. Based on the TGA, the weight loss was 1.0 percent per hour.

Examples 1–14

For Examples 1 and 3, a reactor was warmed up to 35° C. The following were added to the reactor: toluene (900 milliliters), 10% t-BACl in water (24.0 grams), deionzed water (23.4 grams), and ethanol (8.0 grams) with stirring. Separately, a silane mixture was prepared in a teflon bottle by adding: phenyl trichlorosilane (81.0 grams), vinyl trichlorosilane (61.8 grams), and trichlorosilane (69.1 grams). Toluene (100 milliliters) was added to the mixture. Using a peristaltic pump, the silane mixture was added into reactor over period of 1 hour. The temperature was monitored in 5 minute segments. The lines with rinsed with toluene for 10 minutes. After one hour, a GPC sample was taken and Mw was checked. After the Mw reached 30,000, the reaction was terminated. The solution was filtered using a Buchner funnel with paper filter #1 or 4. The solution was transferred into a separatory funnel and mixture of water (200 milliliters) and ethanol (50 milliliters) was added. The funnel mixture was shaken well several times. The aqueous layer was drained out. The solution was filtered through 0.45 micron Teflon or nylon filter in the Buchner funnel. The solution was transferred into a distillation flask and toluene (300 grams) was added. The toluene was distilled off on the Rotovap to approximately 200 grams. Cyclohexanone (400 grams) was added and distilled down to approximately 200 grams again. The prior step was repeated. The solution was transferred into a teflon bottle and cyclohexanone was added to a total of 700 grams. The final Mw was checked with GPC.

For Examples 2 and 4 through 14, the above was repeated except that the starting monomers and amounts used were as follows in Table 1.

TABLE 1

| Example | Ph, mole | Ph, gm | Vi, mole | Vi, gm | SiH, mole | SiH, gm | Me, mole | Me, gm | Benzyl, mole | Benzyl, gm | Ethanol, gm |
|---|---|---|---|---|---|---|---|---|---|---|---|
| 1 | 30 | 81.024 | 30 | 61.824 | 40 | 69.12 | 0 | 0 | 0 | 0 | |
| 2 | 0 | 0 | 15 | 30.912 | 50 | 86.4 | 0 | 0 | 35 | 101.248 | |
| 3 | 30 | 81.024 | 30 | 61.824 | 40 | 69.12 | 0 | 0 | 0 | 0 | 16 |
| 4 | 30 | 81.024 | 30 | 61.824 | 25 | 43.2 | 15 | 28.608 | 0 | 0 | |
| 5 | 30 | 81.024 | 15 | 30.912 | 40 | 69.12 | 15 | 28.608 | 0 | 0 | |
| 6 | 0 | 0 | 30 | 61.824 | 40 | 69.12 | 0 | 0 | 30 | 86.784 | |
| 7 | 35 | 94.528 | 45 | 92.736 | 20 | 34.56 | | | | | |
| 8 | 30 | 81.024 | 55 | 113.344 | 15 | 25.92 | | | | | |
| 9 | 35 | 94.528 | 15 | 30.912 | 50 | 86.4 | | | | | |
| 10 | 35 | 94.528 | 15 | 30.912 | 50 | 86.4 | | | | | |
| 11 | 30 | 81.024 | 15 | 30.912 | 55 | 95.04 | | | | | |
| 12 | 30 | 81.024 | 40 | 82.432 | 30 | 51.84 | | | | | |
| 13 | 16 | 43.2128 | 48 | 98.9184 | 36 | 62.208 | | | | | |
| 14 | 28 | 75.6224 | 36 | 74.1888 | 36 | 62.208 | | | | | |

The analytical results are in the following Table 2. In Table 2, Example 2, B means that benzyl was used instead of phenyl.

Figure 4:
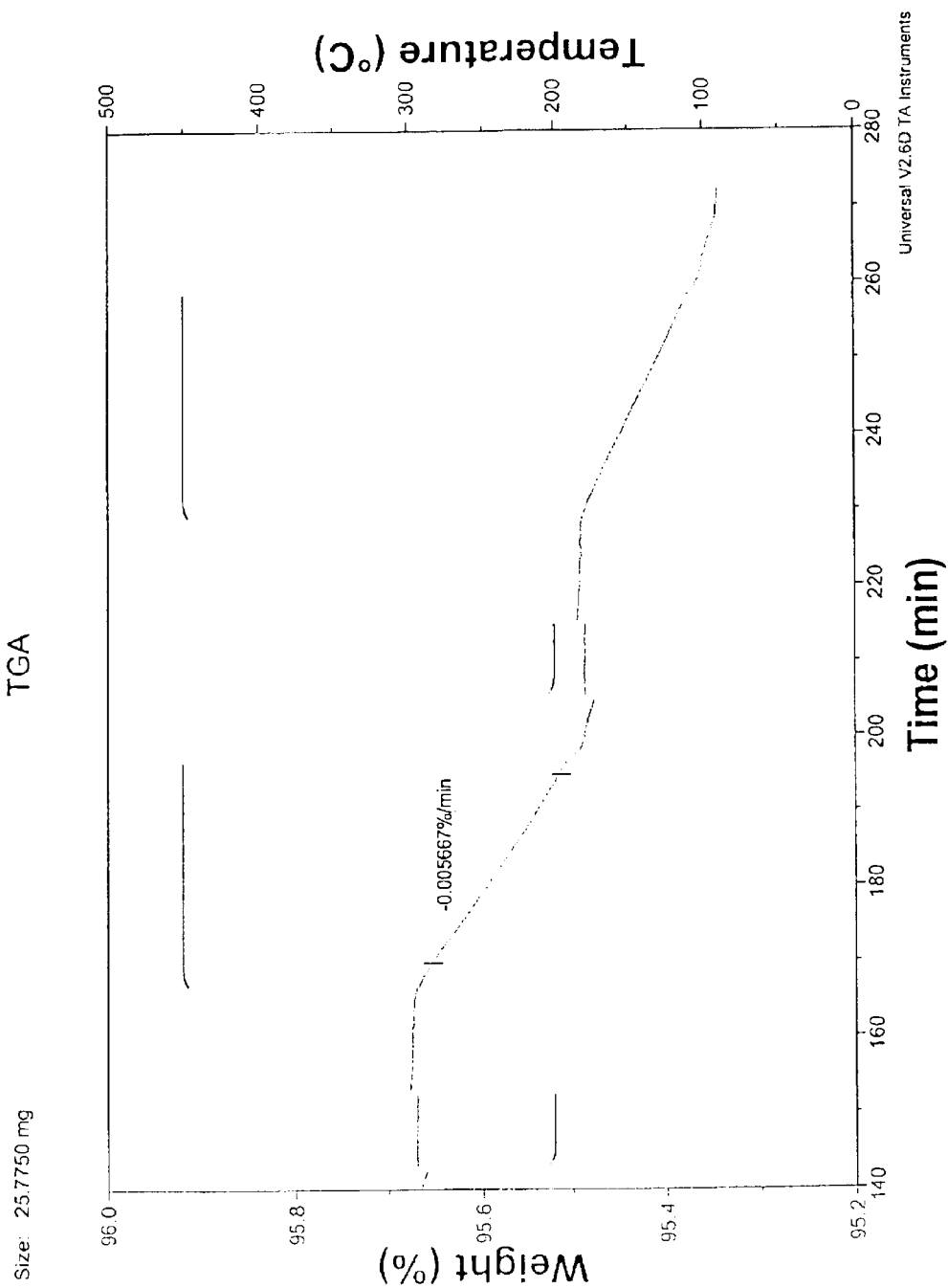
FIG. 4 shows TGA data for the present composition.

The TGA for Example 1 is shown in FIG. 4. The program was: (a) ramp to 200° C. and hold for 15 minutes at 200° C., (b) then ramp to 430° C. and hold for 90 minutes at 430° C., and (c) two cycles ramping from 200° C. to 450° C. with a hold at 450° C. for 30 minutes. Unlike Comparative B above, the inventive composition advantageously shows based on the TGA, a weight loss of 0.34 percent per hour.

Figure 5:
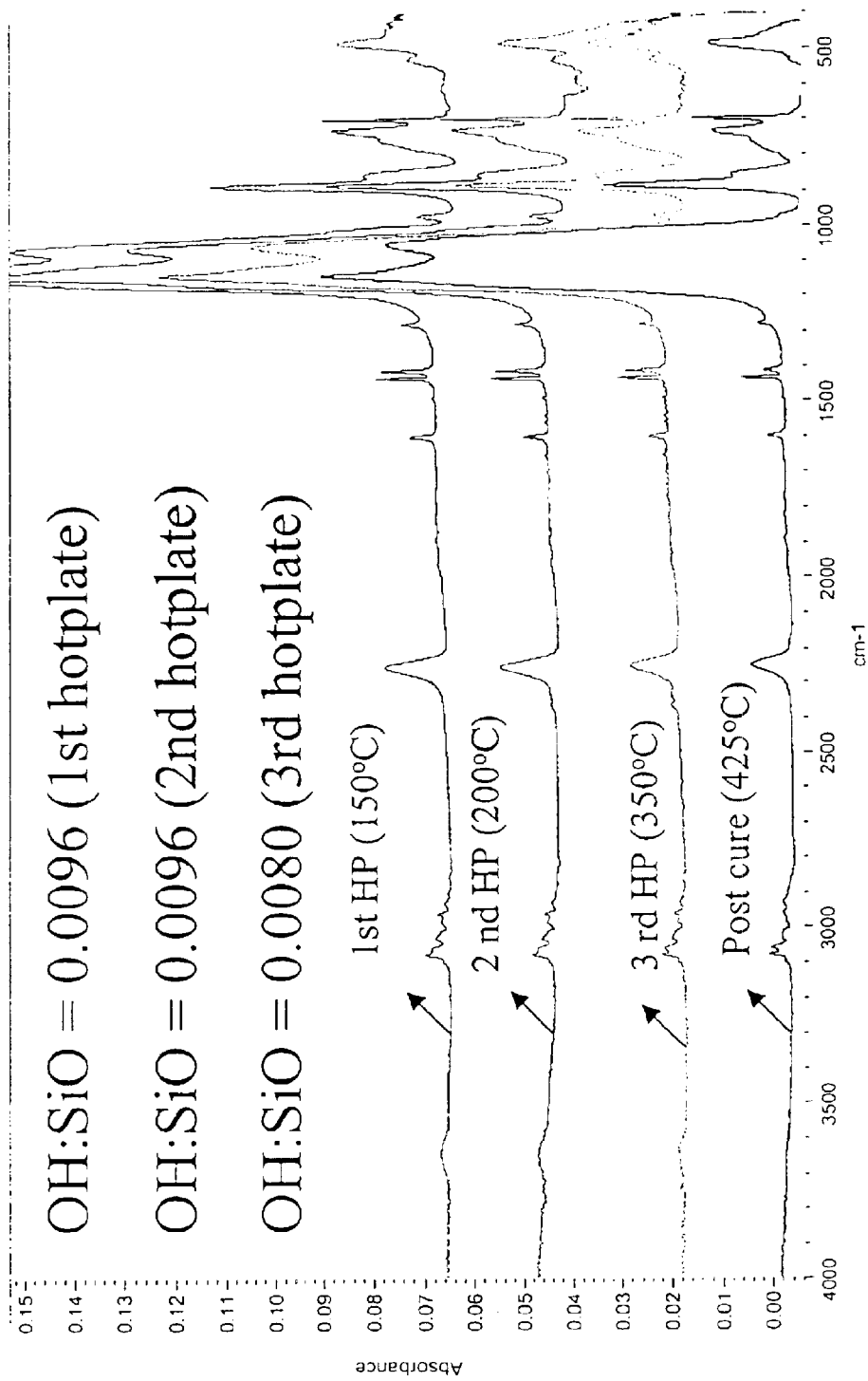
FIG. 5 shows FTIR data for the present composition.

The FTIR for Example 1 is shown in FIG. 5. After each processing step, the FTIR was determined as shown in FIG. 5. The ratio of silanol to SiO shows that little silanol is present relative to SiO present.

The contact angle with the organic dielectric of commonly assigned pending patent application U.S. Serial 60/350,187 filed Jan. 15, 2002 ranged from 10°–15°.

TABLE 2

| Example | Phenyl/ Vinyl/ Hydrogen | [EtOH]/[Si] | MW | Yield | Rx Time | Si wt % (calculated) | C wt % (calculated) | C wt % (actual) | H wt % (calculated) | H wt % (actual) |
|---|---|---|---|---|---|---|---|---|---|---|
| | | | Toluene | | | | | | | |
| 1 | 30/30/40 | 0 | | | | | | | | |
| 2 | 35B/15V/50H | 0.136 | | | | | | | | |
| 3 | 30/30/40 | 0.27 | 18k | 75% | 3 h | 33.5 | 34.4 | 37.39 | 3.3 | 3.24 |
| 4 | 30/30/25/15M | 0.136 | | 64.60% | | 32.7 | 35.7 | | 3.6 | |
| 5 | 30/15/40/15M | 0.136 | 35.8k | 61% | 18 h | 34.2 | 33 | | 3.4 | |
| 6 | 30B/30/40 | 0.136 | 32k | 53.60% | 20 h | 31.9 | 36.9 | | 3.9 | |
| 7 | 35/45/20 | 0.136 | 8.5K | 66.5% | 42 h | 30.7 | 39.4 | 38.61 | 3.6 | 3.69 |
| 8 | 30/55/15 | 0.136 | 9.8K | 81.0% | 46 h | 31.1 | 38.6 | 32.47 | 3.7 | 3.67 |
| 9 | 35/15/50 | 0.136 | 29K | 62.3% | 1.5 h | 33.5 | 34.5 | 35.38 | 3.2 | 3.19 |
| 10 | 35/15/50 | 0 | 11k | 53.2% | 21 h | 33.5 | 34.5 | | 3.2 | |
| 11 | 30/15/55 | 0.136 | 22.5K | 64.2% | 1.5 h | 35.1 | 31.6 | | 3.1 | |
| 12 | 30/40/30 | 0.136 | 15.0K | 65.8% | 23 h | 32.5 | 36.2 | 27.07 | 3.5 | 3.37 |
| 13 | 16/48/36 | 0.136 | 48.2K | 76.7% | 2.5 h | 36.1 | 29.7 | | 3.3 | |
| 14 | 28/36/36 | 0.136 | 32.7K | 70.5% | 21 h | 33.5 | 34.4 | | 3.4 | |

TABLE 2-continued

| Example | Shrinkage (−)/ Expansion (+) | Refractive Index | De-gassed k | Delta k | IR SiPh/SiO | SiVi/SiO | SiH/SiO | FTIR 1136/1058 | ITGA(%/hr) |
|---|---|---|---|---|---|---|---|---|---|
| | | | Degas was at 200° for 2 minutes | | 1436 cm-1 | 1410 cm-1 | 2248 cm-1 | | |
| 1 | +15% | 1.4546 | | | 0.00392 | 0.00369 | 0.0382 | 1.19 | 0.337; .237 |
| 2 | +2.6% | 1.4834 | | | | | | | |
| 3 | +4.2% | 1.4618 | 2.98 | 3.54% | 0.00356 | 0.00264 | 0.0323 | 1.098 | 0.591; .411 |
| 4 | | | 2.91 | 3.00% | | | | | |
| 5 | +4.05% | 1.46 | 2.91 | 2.50% | 0.0379 | 0.00195 | 0.0371 | 1.258 | |
| 6 | +1.54% | 1.4782 | 3.14 | 7.84% | Na | 0.00135 | 0.027 | 0.993 | |
| 7 | 0% | 1.4715 | | | 0.00384 | 0.00232 | 0.01286 | 1.15 | 0.534; .405 |
| 8 | −3.10% | 1.4579 | | | 0.00302 | 0.00193 | 0.00803 | 1.01 | 0.395; .303 |
| 9 | +2.5% | 1.4713 | | | 0.00425 | 0.00149 | 0.04685 | 1.3 | 0.611; .407 |
| 10 | +27% | 1.473 | 2.93 | 3.61% | 0.00438 | 0.0018 | 0.04133 | 1.2 | 0.541; .423 |
| 11 | +1.5% | 1.459 | | | 0.00334 | 0.00136 | 0.0488 | 1.06 | |
| 12 | +3.2% | 1.4517 | | | 0.00361 | 0.0034 | 0.0024 | 1.154 | 0.472;.360 |
| 13 | | | | | 0.00125 | 0.00441 | 0.0261 | 0.904 | |
| 14 | | | | | 0.00373 | 0.00462 | 0.028 | 1.094 | |

Examples 15–17

The compositions of Examples 1–3 were used for these Examples. The compositions were spun and baked and the baked film results are in Table 3.

TABLE 3

| Example | Starting Material | % Solids | Film thickness (Å) | Refractive Index | Spin Speed (rpm) | SVG thickness (Å) |
|---|---|---|---|---|---|---|
| 15 | Ex. 3 | 1.40% | 249.24 | 1.486 | 2200 | 163.69 |
| 16 | Ex. 2 | 1.60% | 245.42 | 1.489 | 3000 | 290.87 |
| 17 | Ex. 1 | 1.60% | 244.49 | 1.490 | 3000 | 285.02 |

The final weight-average molecular weight was 11,800 with polydispersity of 6.3. Solid content of the solution was 10.31 wt. %.

Example 18

Solution from Example 1 was spun onto one high Resistivity and one low Resistivity 8" silicone wafers at a spin speed of 1000 rpm. The wafer was baked at 150° C., 200° C., and 350° C. for one minute each. The post-bake film was then cured in a furnace with flowing nitrogen at 400° C. for 1 hour. Thickness of the post-cure film was 3776 Å with refractive index of 1.459. The film expanded 2.1% from post-bake to post-cure. FTIR of the film measured on the high Resistivity wafer showed the presence of SiH (2248 cm-1 and 884 cm-1), Si-phenyl (1432 cm-1), Si-vinyl (1411 cm-1), and SiC (1275 cm-1). Peak heights at 1136 cm-1 (indicating cage SiO structure) and at 1058 cm-1 (indicating branch SiO structure) were measured. The ratio between the peak height at 1136 cm-1 and 1058 cm-1 was 1.20. Dielectric constant of the film was measured on the low Resistivity wafer. The dielectric constant was 2.90. The capacitance of the film was measured again after heating the wafer in a hot plate at 200° C. for 2 minutes in order to drive off adsorbed moisture. The capacitance decreased by 1.4% after the heating.

Example 19

The 10.31 wt % solution from Example 1 was diluted with cyclohexanone to 1.6 wt %. Films were spun on 8" wafer at 4 different spin speeds and then baked at 150C/200C/350C for 1 minute each. Post-bake thickness were: 219 Å at 4000 rpm, 250 Å at 3000 rpm, 302 Å at 2000 rpm, and 421 Å at 4000 rpm.

Example 20

The 1.60 wt % solution from Example 19 was further diluted with cyclohexanone to four different concentrations: 1.00%, 0.75%, 0.50%, and 0.25%. Post-bake thickness at different spin speeds were shown in the following table:

| | 1000 rpm | 2000 rpm | 3000 rpm | 4000 rpm |
|---|---|---|---|---|
| 1.00 wt % | 261 Å | 188 Å | 154 Å | 135 Å |
| 0.75 wt % | 196 Å | 141 Å | 116 Å | 102 Å |
| 0.50 wt % | 133 Å | 95 Å | 77 Å | 69 Å |
| 0.25 wt % | 67 Å | 50 Å | 37 Å | 35 Å |

All films showed good uniformity and wetability.

Example 21

Dried resin powder from solution of Example 1 was obtained by vacuum evaporation of the solvent at temperature below 120C. 27.7880 mg of the dried resin was put into TGA under flowing nitrogen. The sample was heated using the following cycle:
(1) from 30° C. to 200° C. at 25° C./min and held at 200° C. for 15 minutes,
(2) from 200° C. to 430° C. at 10° C./min and held at 430° C. for 90 minutes,
(3) cool to 200° C. in 10 minutes, hold at 200° C. for 10 minutes and heat to 450° C. in minutes,
(4) hold at 450° C. for 30 minutes,
(5) cool to 200° C. in 10 minutes, hold at 200° C. for 10 minutes and heat to 450° C. in minutes,
(6) hold at 450° C. for 30 minutes,
(7) free cool to room temperature.
Weight loss percents for step (4) and step (6) were 0.37% and 0.25%, respectively.

Example 22

Cyclohexanone was added to a composition of Example 1 above. The solution was spun onto a film of an organic highly aromatic high temperature dielectric layer. The purpose of the inventive layer was to serve as an etch stop. A second layer of the same organic dielectric layer was spun onto the etch stop layer. The following etch recipe was used: 20 millitorr, 1000 Watts, 120 $N_2$/30 $O_2$, and 40° C. The $O_2$ quickly etched the organic dielectric layer. The etch rate of the organic dielectric layer was 5540 Angstroms/minute while the etch rate of the inventive layer was 241 Angstroms/minute and therefore, served as an etch stop.

Example 23

Example 1 was repeated except that the solvent used was propylene glycol methyl ether acetate (PGMEA) with a final concentration 10.77%. It was concentrated and re-diluted to 13.49% and filtered with 0.1 micron syringe filter. The composition was spun onto a wafer. The wafer was baked at 150° C., 200° C., and 350° C. for one minute each. The post-bake film was then cured in a furnace with flowing nitrogen at 400° C. for 1 hour. Film results are in the following table where RI stands for refractive index.

| Spin condition | Thickness (Angstroms, post baked) | RI (post baked) | Thickness (Angstroms, post cured) | RI (post baked) | Modulus (Gpa) | Hardness (GPa) |
|---|---|---|---|---|---|---|
| 300 rpm/20s | 5653.20 | 1.483 | 5775.90 | 1.454 | 5.80 +/− 0.47 | 0.731 +/− 0.12 |
| 150 rpm/20s | 5784.45 | 1.496 | 6087.67 | 1.457 | 4.81 +/− 0.34 | 0.545 +/− 0.087 |

Example 24

In a copper dual damascene process, a dense stacked dielectric system was formed as follows. A adhesion promoter layer using the composition of Example 1 was applied to a barrier. (Typical thicknesses of the adhesion promoter layer are 25–80 Angstroms with a uniformity of +5–10 Angstroms.) A layer of Honeywell GX-3™ dense adamantane dielectric material was then applied to the adhesion promoter layer. A layer of the adhesion promoter was then applied. A hard mask/CMP stop layer was then applied. After 3 psi chemical mechanical planarization processing, the Example 1 and GX-3™ layer interface remained intact, i.e., no delamination.

It is also possible to form an adhesion promoter layer using the composition of Example 1 and propylene glycol methyl ether acetate solvent instead of cyclohexanone.

Example 25

In a copper dual damascene process, a porous stacked dielectric system was formed as follows. A adhesion promoter layer using the composition of Example 1 was applied to a barrier. A layer of Honeywell GX-3P™ porous adamantane based dielectric material was then applied to the adhesion promoter layer. A buried etch stop using the composition of Example 1 was then applied. (Typical thicknesses of the buried etch stop layer are 250 Angstroms with a uniformity of ±10 Angstroms.) A layer of Honeywell GX-3P™ porous adamantane based dielectric material was then applied to the buried etch stop layer. A hard mask/CMP stop using the composition of Example 1 was then applied. (Typical thicknesses of the hard mask/CMP stop layer are 500 Angstroms with a uniformity of ±10 Angstroms.)

It is also possible to form an etch stop layer using the composition of Example 1 and propylene glycol methyl ether acetate (PGMEA) solvent instead of cyclohexanone. It is also possible to form a hard mask/CMP stop layer using the composition of Example 1 and propylene glycol methyl ether acetate (PGMEA) solvent instead of cyclohexanone.

Example 26

A layer of Honeywell GX-3™ dense adamantane based dielectric material was applied to a Si substrate; the applied layer had a thickness of 4000 Angstroms. A layer of the composition of Example 1 was then applied; this applied layer had a thickness of 2400 Angstroms. This structure passed the tape test.

Example 27

A layer of Honeywell NANOGLASS® porous silica dielectric material was applied to a Si substrate; the applied layer had a thickness of 3000 Angstroms. A layer of the composition of Example 1 was then applied; this applied layer had a thickness of 2400 Angstroms. This structure passed the tape test.

Example 28

The glass transition temperature of the composition of Example 1 is greater than 500° C.

What is claimed is:

1. A chemical vapor deposition precursor comprising an organosiloxane, the organosiloxane comprising at least 80 weight percent of Formula I: $[Y_{0.01-1.0}SiO_{1.5-1.99}]_a[Z_{0.0-1.0}SiO_{1.5-1.99}]_b[H_{0.01-1.0}SiO_{1.5-1.99}]_c$ where Y is aryl; Z is alkenyl; a is from 15 percent to 70 percent of Formula I; b is from 2 percent to 50 percent of Formula I; and c is from 20 percent to 80 percent of Formula I.

2. The organosiloxane of claim 1 wherein said Y is selected from phenyl, benzyl, substituted phenyl, naphthyl, anthryl, and phenanthryl, wherein Y and Z are different.

3. The organosiloxane of claim 1 wherein said Z is selected from vinyl, substituted vinyl, vinyl ether, aciylate, and merhacrylate.

4. A film comprising said chemical vapor deposition precursor of claim 1.

5. A hardmask comprising the organosiloxane of claim 1.

6. The hardmask of claim 5 additionally comprising solvent.

7. The hardmask of claim 6 wherein said solvent is cyclohexanone or propylene glycol methyl ether acetate.

8. An etch stop comprising the organosiloxane of claim 1.

9. The etch stop of claim 8 additionally comprising solvent.

10. The etch stop of claim 9 wherein said solvent is cyclohexanone or propylene glycol methyl ether acetate.

11. A semiconductor device comprising said film of claim 4 and additionally comprising a second film that is adjacent to said first film.

12. The semiconductor device of claim 11 wherein said film is an inorganic material.

13. The semiconductor device of claim 11 wherein said second film is an organic material.

14. The semiconductor device of claim 13 wherein said organic material comprises aromatic or aliphatic hydrocarbon.

15. The semiconductor device of claim 13 wherein said organic material comprises adamantane or diamantane based material.

16. The semiconductor device of claim 11 having a dielectric constant of less than 3.2.

17. A method of film formation comprising the step of:

depositing a composition of at least 80 weight percent of Formula I:

$[Y_{0.01-1.0}SiO_{1.5-1.99}]_a[Z_{0.01-1.0}SiO_{1.5-1.99}]_b[H_{0.01-1.99}SiO_{1.5-1.99}]_c$ where Y is aryl; Z is alkenyl; a is from 15 percent to 70 percent of Formula I; b is from 2 percent to 50 percent of Formula I; and c is from 20 percent to 80 percent of Formula I onto a substrate, wherein Y and Z are different.

18. The method of claim 17 wherein said depositing comprises chemical vapor deposition.

19. The method of claim 17 additionally comprising subjecting said deposited composition to thermal energy, microwave radiation, ultraviolet radiation, or electron beam radiation.

* * * * *